United States Patent
Tsai et al.

(10) Patent No.: US 8,664,055 B2
(45) Date of Patent: Mar. 4, 2014

(54) FIN FIELD-EFFECT TRANSISTOR STRUCTURE AND MANUFACTURING PROCESS THEREOF

(71) Applicant: United Microelectronics Corporation, Hsinchu (TW)

(72) Inventors: Teng-Chun Tsai, Tainan (TW); Chun-Yuan Wu, Yunlin County (TW); Chin-Fu Lin, Tainan (TW); Chih-Chien Liu, Taipei (TW); Chin-Cheng Chien, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/693,009

(22) Filed: Dec. 3, 2012

(65) Prior Publication Data

US 2013/0089957 A1 Apr. 11, 2013

Related U.S. Application Data

(63) Continuation of application No. 13/052,338, filed on Mar. 21, 2011, now Pat. No. 8,361,854.

(51) Int. Cl.
*H01L 21/8238* (2006.01)

(52) U.S. Cl.
USPC ............ 438/197; 438/199; 257/206; 257/288

(58) Field of Classification Search
USPC ........................... 438/197, 199; 257/206, 288
See application file for complete search history.

(56) References Cited

U.S. PATENT DOCUMENTS

| | | | |
|---|---|---|---|
| 6,376,888 B1 | 4/2002 | Tsunashima | |
| 6,403,435 B1 * | 6/2002 | Kang et al. | 438/311 |
| 6,413,802 B1 * | 7/2002 | Hu et al. | 438/151 |
| 6,436,775 B2 | 8/2002 | Kim | |
| 6,756,277 B1 | 6/2004 | Yu | |
| 6,855,607 B2 | 2/2005 | Achuthan | |
| 6,855,989 B1 * | 2/2005 | Wang et al. | 257/349 |
| 6,869,868 B2 | 3/2005 | Chiu | |
| 6,921,963 B2 | 7/2005 | Krivokapic | |
| 6,970,372 B1 * | 11/2005 | Furukawa et al. | 365/149 |
| 6,972,461 B1 | 12/2005 | Chen | |
| 7,041,542 B2 * | 5/2006 | Ahmed et al. | 438/183 |
| 7,091,551 B1 | 8/2006 | Anderson | |
| 7,122,412 B2 | 10/2006 | Chen | |
| 7,348,641 B2 | 3/2008 | Zhu | |
| 7,425,740 B2 | 9/2008 | Liu | |
| 7,531,437 B2 * | 5/2009 | Brask et al. | 438/585 |
| 2006/0286729 A1 | 12/2006 | Kavalieros | |
| 2008/0157208 A1 | 7/2008 | Fischer | |
| 2010/0072553 A1 | 3/2010 | Xu | |
| 2012/0088345 A1 | 4/2012 | Chen | |

* cited by examiner

*Primary Examiner* — William D Coleman
*Assistant Examiner* — Nicholas Tobergte
(74) *Attorney, Agent, or Firm* — Ding Yu Tan

(57) ABSTRACT

A fin field-effect transistor structure includes a substrate, a fin channel and a high-k metal gate. The high-k metal gate is formed on the substrate and the fin channel. A process of manufacturing the fin field-effect transistor structure includes the following steps. Firstly, a polysilicon pseudo gate structure is formed on the substrate and a surface of the fin channel. By using the polysilicon pseudo gate structure as a mask, a source/drain region is formed in the fin channel. After the polysilicon pseudo gate structure is removed, a high-k dielectric layer and a metal gate layer are successively formed. Afterwards, a planarization process is performed on the substrate having the metal gate layer until the first dielectric layer is exposed, so that a high-k metal gate is produced.

18 Claims, 10 Drawing Sheets

FIN FIELD-EFFECT TRANSISTOR STRUCTURE AND MANUFACTURING PROCESS THEREOF

CROSS-REFERENCE TO RELATED APPLICATION

This application is a continuation application of an application Ser. No. 13/052,338, filed on Mar. 21, 2011, now pending. The entirety of the above-mentioned patent application is hereby incorporated by reference herein and made a part of this specification.

FIELD OF THE INVENTION

The present invention relates to a fin field-effect transistor structure, and more particularly to a fin field-effect transistor structure applied to a semiconductor component. The present invention also relates to a manufacturing process of such a fin field-effect transistor structure.

BACKGROUND OF THE INVENTION

Nowadays, as integrated circuits are increasingly developed toward miniaturization, the conventional two-dimensional transistor structures usually fail to meet the practical requirements. Especially, the performance of the conventional two-dimensional transistor structure in high-speed circuitry is unsatisfied because the current driving capability is insufficient. For solving these drawbacks, a fin field-effect transistor (FinFET) structure has been disclosed. FIG. 1 is a schematic view illustrating a FinFET structure according to the prior art. Like the typical FET structure, the FinFET structure of FIG. 1 comprises a substrate 10, a source 11, a drain 12, a gate insulator layer 13 and a gate conductor layer 14. However, since a channel (not shown) between the source 11 and the drain 12 is covered by the gate insulator layer 13 and the gate conductor layer 14, three surfaces are utilized to provide more current paths. In other words, the FinFET structure has better current driving capability than the typical FET structure. However, it is found that downscaling and optimizing the FinFET structure is a challenge.

Therefore, there is a need of providing an improved fin field-effect transistor structure to obviate the drawbacks encountered from the prior art.

SUMMARY OF THE INVENTION

Therefore, the object of the present invention is to provide a fin field-effect transistor structure and a manufacturing process of the fin field-effect transistor structure in order to overcome the drawbacks encountered from the prior art.

In accordance with an aspect, the present invention provides a manufacturing process of a fin field-effect transistor structure. Firstly, a substrate is provided. Then, a fin channel is formed on the substrate. Then, a polysilicon pseudo gate layer is formed on a surface of the fin channel. By defining the polysilicon pseudo gate layer, a polysilicon pseudo gate structure is formed. Then, by using the polysilicon pseudo gate structure as a mask, a first implantation process is performed to form a source/drain region in the fin channel. Then, a contact etch stop layer and a first dielectric layer are successively formed over the fin channel having the source/drain region, the polysilicon pseudo gate structure and the substrate. Then, a first planarization process is performed on the substrate having the first dielectric layer and the contact etch stop layer until the polysilicon pseudo gate structure is exposed. Then, the polysilicon pseudo gate structure is removed to form a receiving space. Then, a high-k dielectric layer and a metal gate layer are successively formed on the substrate having the receiving space. Afterwards, a second planarization process is performed on the substrate having the metal gate layer until the first dielectric layer is exposed, so that a high-k metal gate is produced.

In an embodiment, the substrate is a silicon-on-insulator wafer including a handle wafer, a buried oxide layer and a silicon layer.

In an embodiment, the fin channel is formed by performing a photolithography and etching process on the silicon layer.

In an embodiment, the polysilicon pseudo gate structure layer includes an inter-layer dielectric layer, a polysilicon layer and a hard mask layer. A photolithography and etching process is performed to define the polysilicon pseudo gate structure layer, thereby forming the polysilicon pseudo gate structure. The polysilicon pseudo gate structure and the fin channel are perpendicular to each other.

In an embodiment, the first planarization process is performed until the polysilicon layer of the polysilicon pseudo gate structure is exposed.

In an embodiment, the step of forming the source/drain region in the fin channel includes sub-steps of performing a lightly doped drain implantation process on the fin channel by using the polysilicon pseudo gate structure as a mask, thereby forming a lightly doped region in the fin channel, forming a spacer structure on a sidewall of the polysilicon pseudo gate structure, and performing a source/drain implantation process on the fin channel that is uncovered by the polysilicon pseudo gate structure and the spacer structure, thereby forming the source/drain region in the fin channel.

In an embodiment, the manufacturing process further includes steps of performing a self-aligned salicidation process on the source/drain region that is uncovered by the polysilicon pseudo gate structure and the spacer structure, thereby forming a salicide layer on a surface of the source/drain region, and performing a sliming process on the spacer structure to reduce the thickness of the spacer structure or completely remove the spacer structure.

In an embodiment, the manufacturing process further includes steps of removing the first dielectric layer and the contact etch stop, which are arranged at both sides of the high-dielectric-constant metal gate, thereby forming at least two slot contact holes, and filling a metal layer in the slot contact holes to form plural slot contact structures.

In an embodiment, the metal layer is made of tungsten.

In an embodiment, the manufacturing process further includes steps of forming a metal gate cap layer and a dielectric layer on the substrate having the plural slot contact structures, forming plural contact holes in the metal gate cap layer and the dielectric layer over the high-k metal gate and the source/drain region, forming a barrier layer and a copper layer formed on the substrate having the plural contact holes, and performing a third planarization process to remove the excess copper layer to form copper contact structures.

In accordance with another aspect, the present invention provides a fin field-effect transistor structure. The fin field-effect transistor structure includes a substrate, a fin channel and a high-k metal gate. The fin channel is formed on the substrate. A source/drain region is formed in both terminals of the fin channel. The high-k metal gate is formed on the substrate and the fin channel. The high-k metal gate includes a high-k dielectric layer and a metal gate layer. The high-k dielectric layer is arranged between the metal gate layer and the fin channel.

In an embodiment, the substrate is a silicon-on-insulator wafer including a handle wafer, a buried oxide layer and a silicon layer.

In an embodiment, the high-k metal gate and the fin channel are perpendicular to each other.

In an embodiment, the source/drain region further includes a lightly doped region.

In an embodiment, a spacer structure is formed on a sidewall of the high-k metal gate.

In an embodiment, the fin field-effect transistor structure further includes a salicide layer, which is formed on a surface of the source/drain region.

In an embodiment, the fin field-effect transistor structure further includes plural slot contact structures, which are arranged at both sides of the high-dielectric-constant metal gate.

In an embodiment, the slot contact structures are made of tungsten.

In an embodiment, the fin field-effect transistor structure further includes plural copper contact structures, which are arranged over the high-dielectric-constant metal gate and the source/drain region and connected with the high-dielectric-constant metal gate and the source/drain region.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 2A, 2B, 2C, 2D, 2E, 2F, 2G, 2H, 2I and 2J are schematic views illustrating a FinFET structure according to an embodiment of the present invention.

Figure 1:
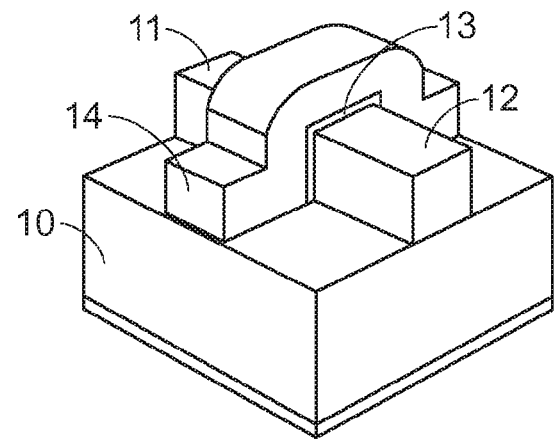
FIG. 1 is a schematic view illustrating a FinFET structure according to the prior art.
Figure 2A:
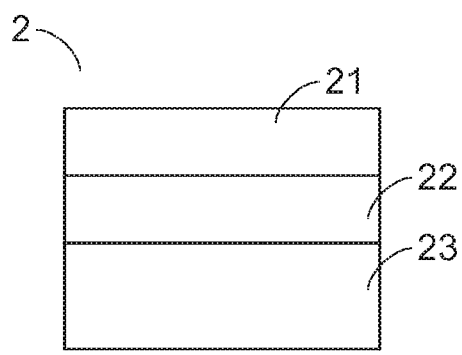
FIGS. 2A, 2B, 2C, 2D, 2E, 2F, 2G, 2H, 2I and 2J are schematic views illustrating a FinFET structure according to an embodiment of the present invention.

Firstly, as shown in FIG. 2A, a substrate 2 is provided. An example of the substrate 2 is a silicon-on-insulator (SOI) wafer with a three-layered configuration. For example, in the substrate 2, the bottom layer 23 is a thicker handle wafer, the intermediate layer is a thinner silicon dioxide insulator layer 22 such as a buried oxide (BOX) layer, and the top layer 21 is a thinner silicon layer.

Figure 2B:
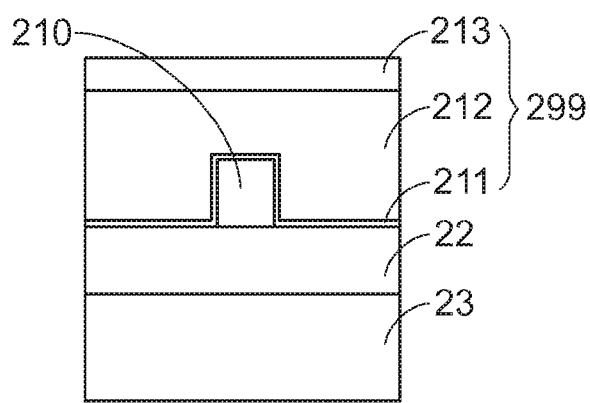
Figure 2C:
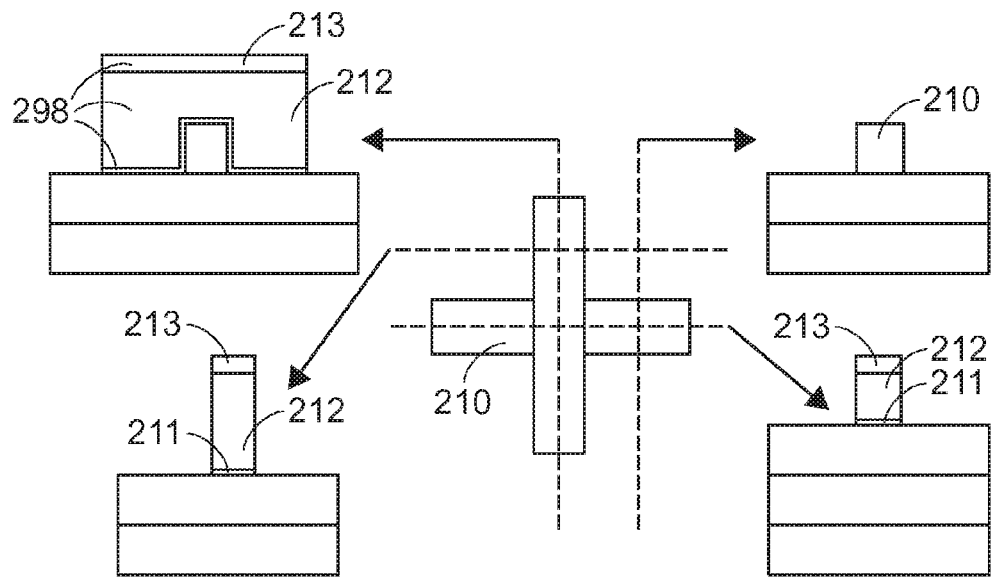

Then, a photolithography and etching process is performed on the silicon layer 21, thereby forming a fin channel 210 as shown in FIG. 2B. Then, an inter-layer dielectric layer 211 and a polysilicon layer 212 are successively formed on the substrate 2 having the fin channel 210. Then, after a planarization process (e.g. a chemical mechanical planarization) is performed on the polysilicon layer 212, a hard mask layer 213 is formed on a surface of the polysilicon layer 212. The resulting structure as shown in FIG. 2B is produced. Meanwhile, a polysilicon pseudo gate layer 299 comprising the inter-layer dielectric layer 211, the polysilicon layer 212 and the hard mask layer 213 is formed.

Then, a photolithography and etching process is performed to define the polysilicon pseudo gate layer 299, thereby forming a polysilicon pseudo gate structure 298. As can be seen from the top view and some cross-sectional views along different viewpoints, the polysilicon pseudo gate electrode 298 and the fin channel 210 are perpendicular to each other.

Figure 2D:
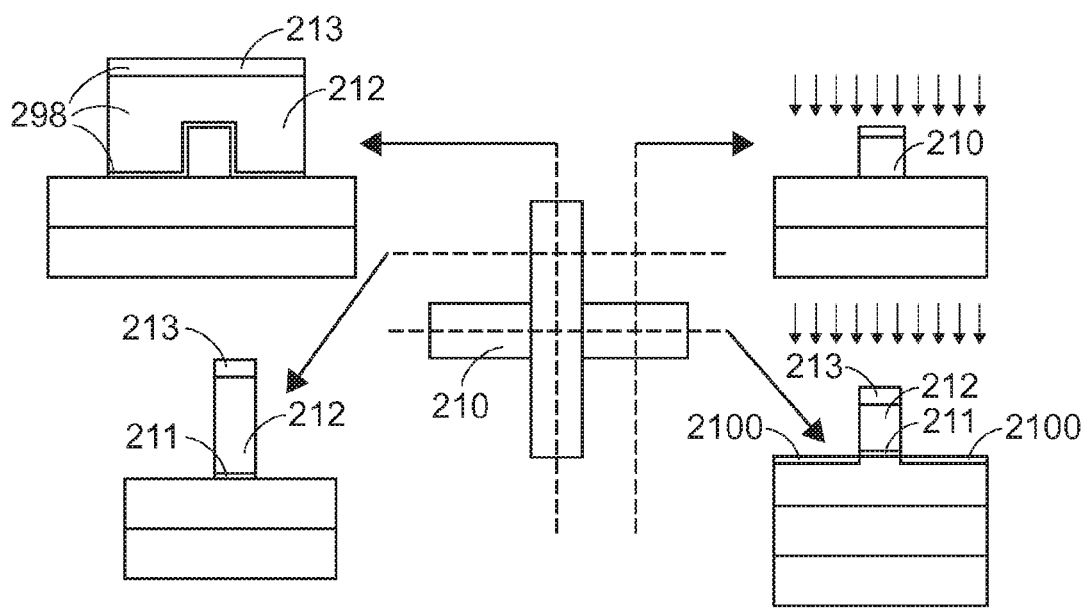

Then, as shown in FIG. 2D, by using the polysilicon pseudo gate structure 298 as a mask, a lightly doped drain (LDD) implantation process is performed on the fin channel 210, thereby forming a lightly doped region 2100 in the fin channel 210.

Figure 2E:
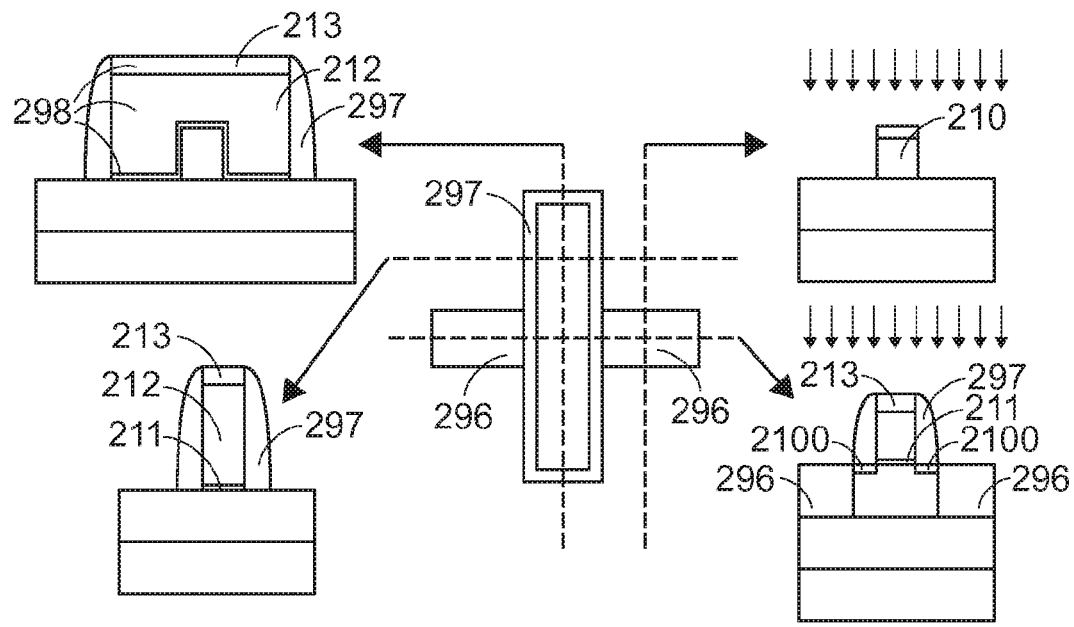

Then, as shown in FIG. 2E, a spacer structure 297 is formed on a sidewall of the polysilicon pseudo gate structure 298. Then, the fin channel 210 uncovered by the polysilicon pseudo gate structure 298 and the spacer structure 297 is subject to a source/drain implantation process, so that a source/drain region 296 is formed in the fin channel 210.

Then, the source/drain region 296 uncovered by the polysilicon pseudo gate structure 298 and the spacer structure 297 is subject to a self-aligned salicidation process, thereby forming a salicide layer 295 on the surface of the source/drain region 296. Then, a sliming process may be optionally performed on the spacer structure 297, thereby reducing the thickness of the spacer structure 297 or completely removing the spacer structure 297. Alternatively, the spacer structure 297 is not removed. In this embodiment, the following steps will be illustrated by referring to the case where the spacer structure 297 is not removed.

Figure 2F:
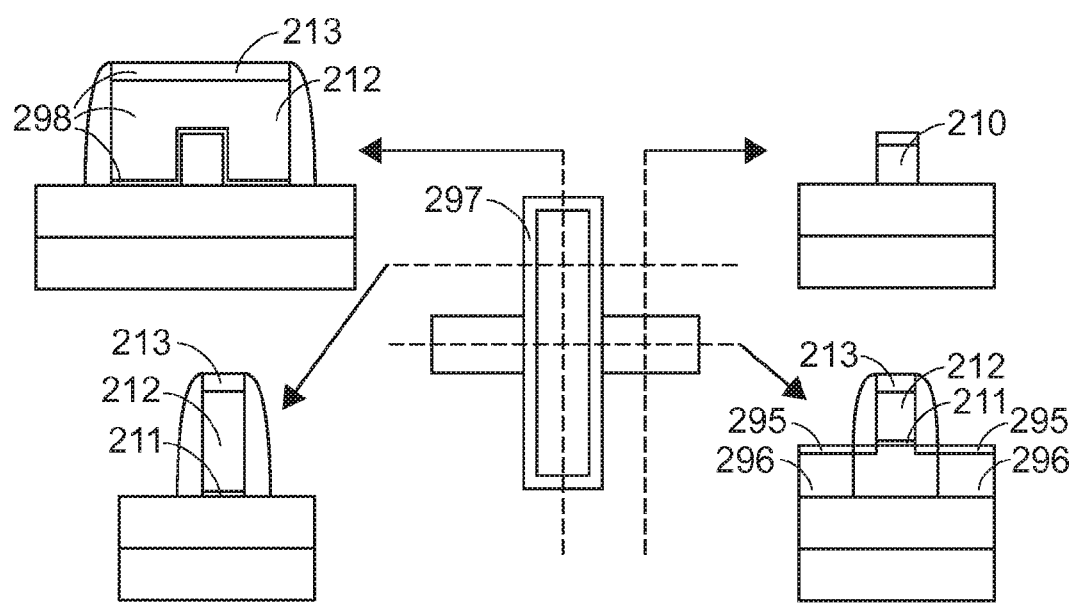
Figure 2G:
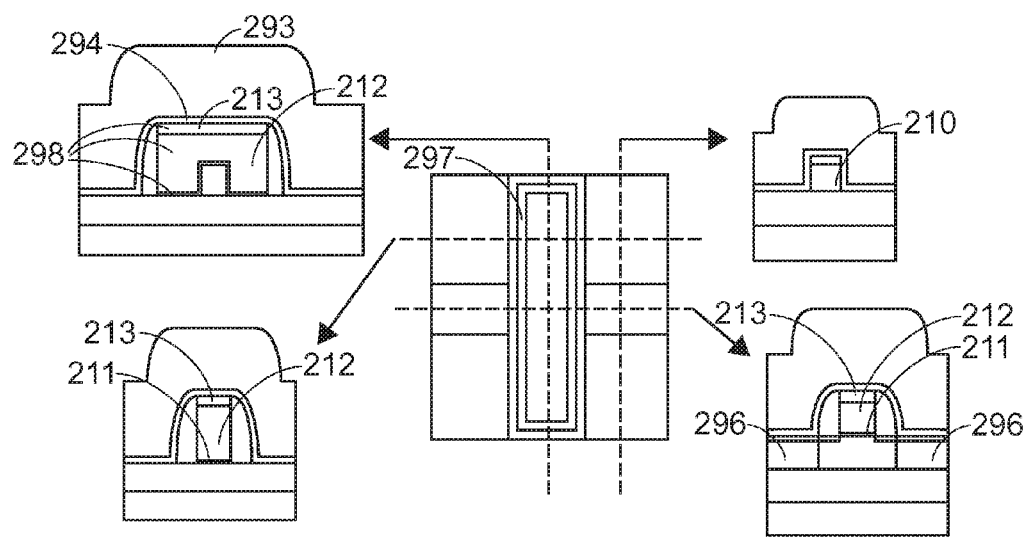

Then, as shown in FIG. 2G, a contact etch stop layer 294 and a first dielectric layer 293 are successively formed over the fin channel 210 having the source/drain region 296, the polysilicon pseudo gate structure 298 and the substrate 2.

Figure 2H:
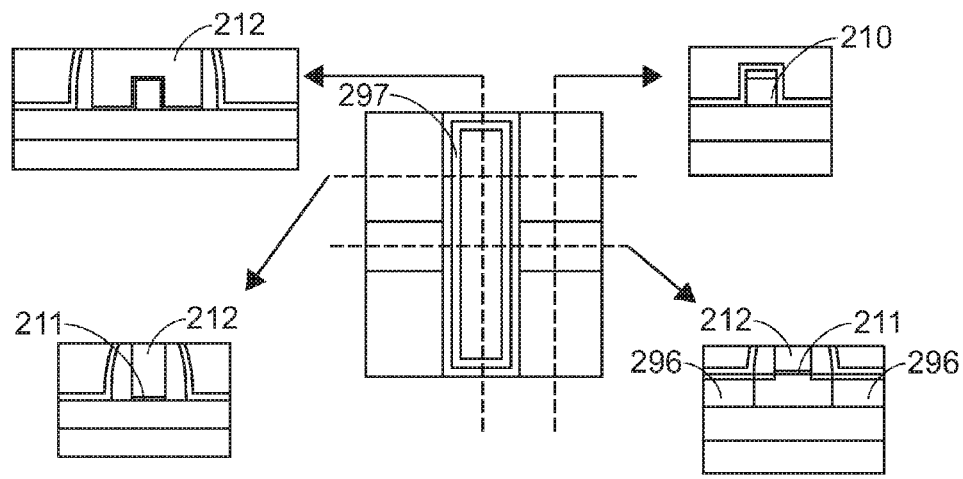

Then, as shown in FIG. 2H, the substrate 2 having the first dielectric layer 293 and the contact etch stop layer 294 is subject to a planarization process (e.g. a chemical mechanical planarization) until the polysilicon layer 212 of the polysilicon pseudo gate structure 298 is exposed.

Figure 2I:
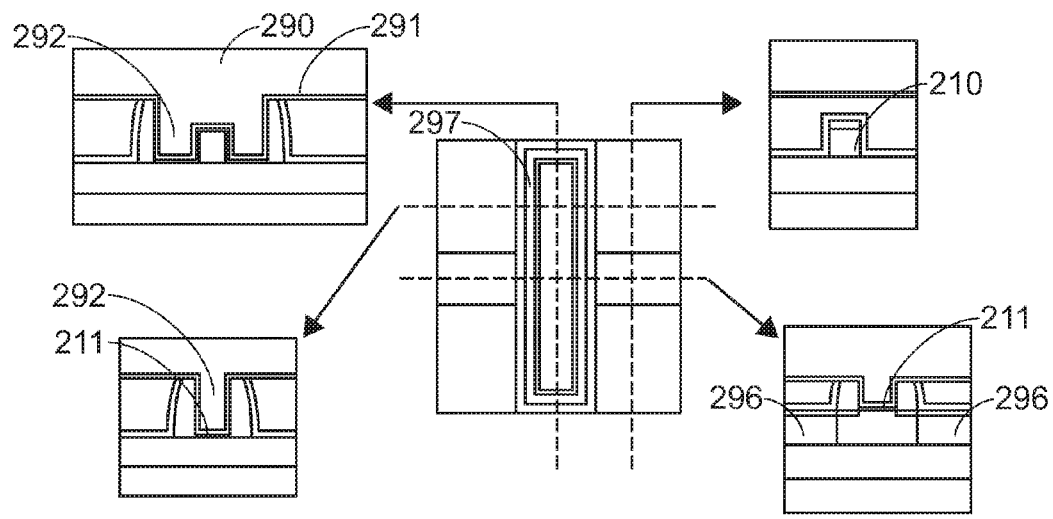

Then, as shown in FIG. 2I, after the polysilicon layer 212 of the polysilicon pseudo gate structure 298 is removed to form a receiving space 292, a high-k dielectric layer 291 and a metal gate layer 290 are successively formed on the substrate 2 having the receiving space 292. Generally, the metal gate layer 290 is a multi-layered structure including a work function adjusting layer, a metal layer and the like.

Afterwards, the substrate 2 with the metal gate layer 290 and the high-k dielectric layer 291 is subject to a planarization process (e.g. a chemical mechanical planarization) until the first dielectric layer 293 is exposed. Meanwhile, a FinFET structure with the high-k metal gate (HKMG) is shown in FIG. 2J.

From the above description, the present invention provides a process of manufacturing a FinFET structure with a high-k metal gate (HKMG). Due to the high-k metal gate, the problems incurred in the process of downscaling and optimizing the FinFET structure will be overcome. Accordingly, the object of the present invention will be achieved.

Figure 2J:
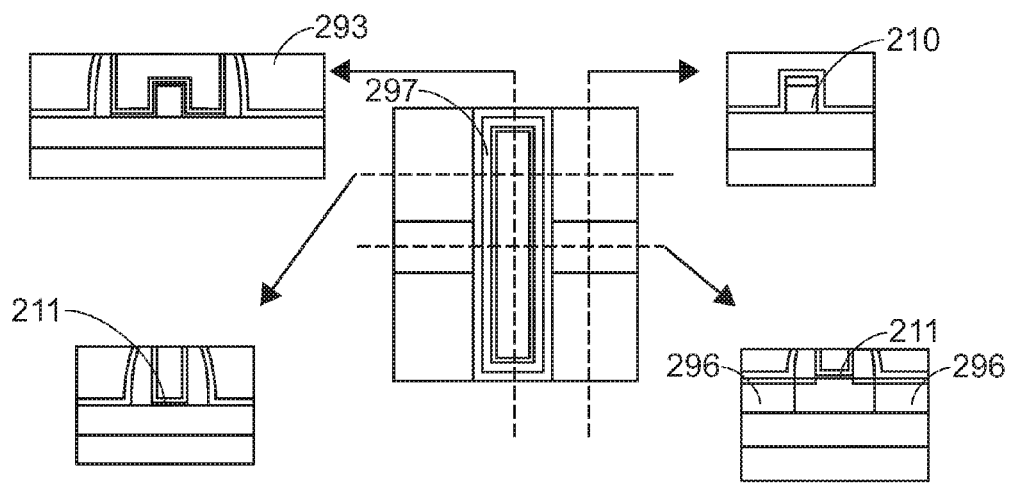

FIGS. 3A, 3B, 3C, 3D, 3E, 3F and 3G are schematic views illustrating a process of forming metal lines and dielectric layers after the FinFET structure with the high-dielectric-constant metal gate as shown in FIG. 2J is produced.

Figure 3A:
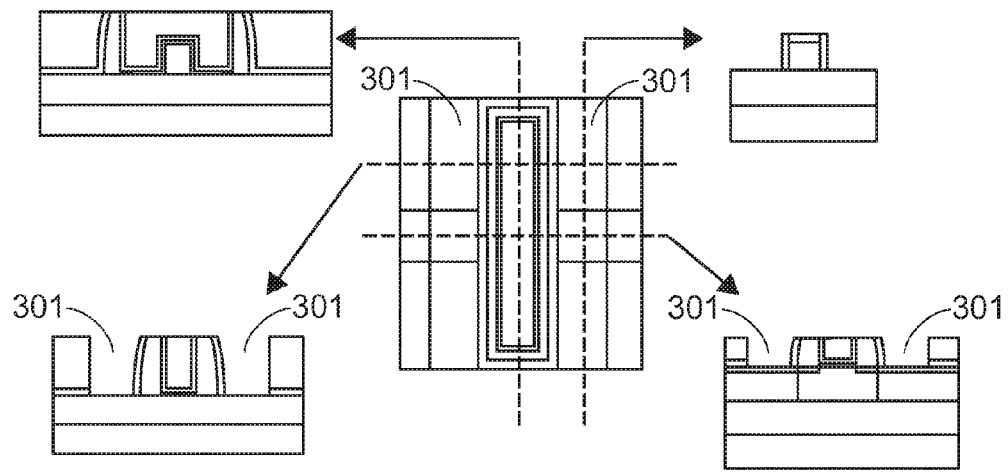
FIGS. 3A, 3B, 3C, 3D, 3E, 3F and 3G are schematic views illustrating a process of forming metal lines and dielectric layers after the FinFET structure with the high-dielectric-constant metal gate as shown in FIG. 2J is produced.

As shown in FIG. 3A, by performing a photolithography and etching process, the first dielectric layer 293 and the contact etch stop layer 294 at both sides of the high-dielectric-constant metal gate are removed to form two slot contact holes 301.

Figure 3B:
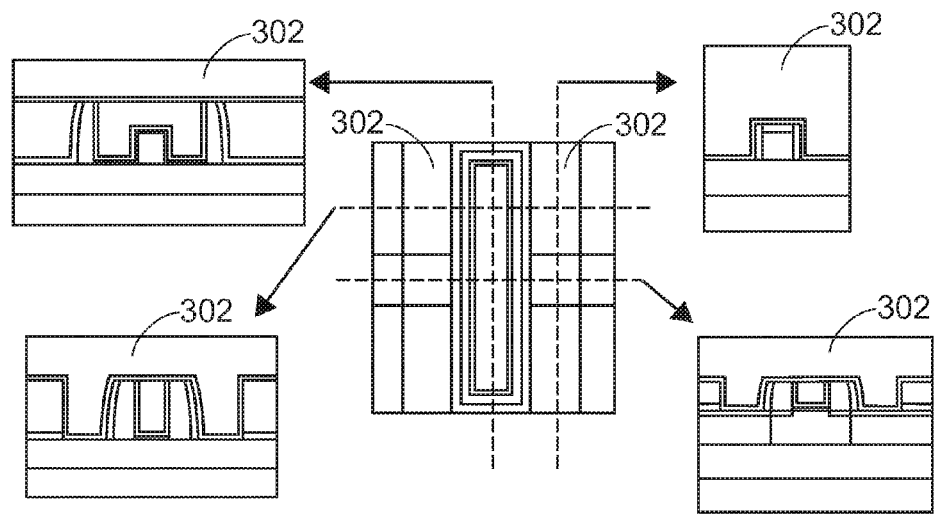
Figure 3C:
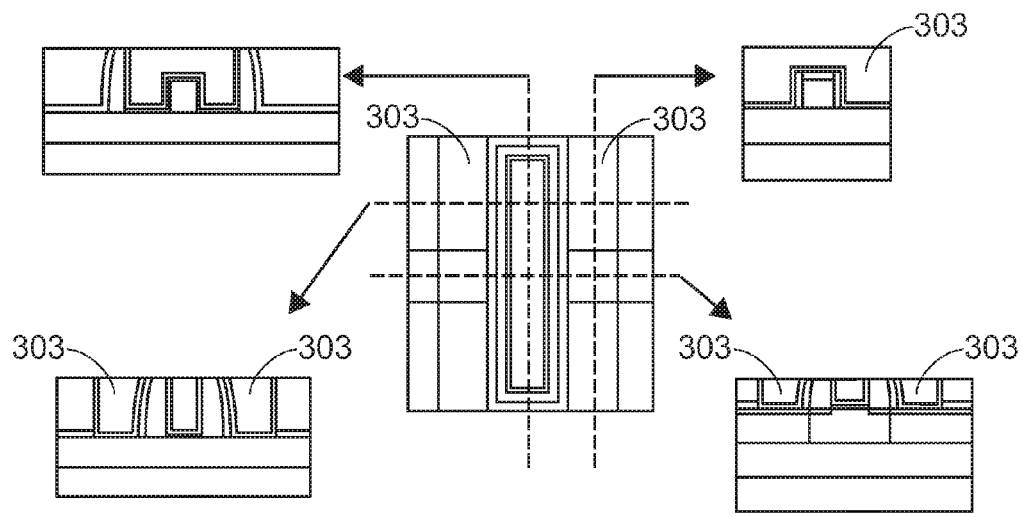

Then, as shown in FIG. 3B, a metal layer 302 (e.g. a tungsten layer) is formed on the substrate 2 and filled in the slot contact holes 301. Then, as shown in FIG. 3C, a planarization process (e.g. a chemical mechanical planarization) is performed to remove the excess metal layer 302, thereby forming slot contact structures 303 in the slot contact holes 301.

Figure 3D:
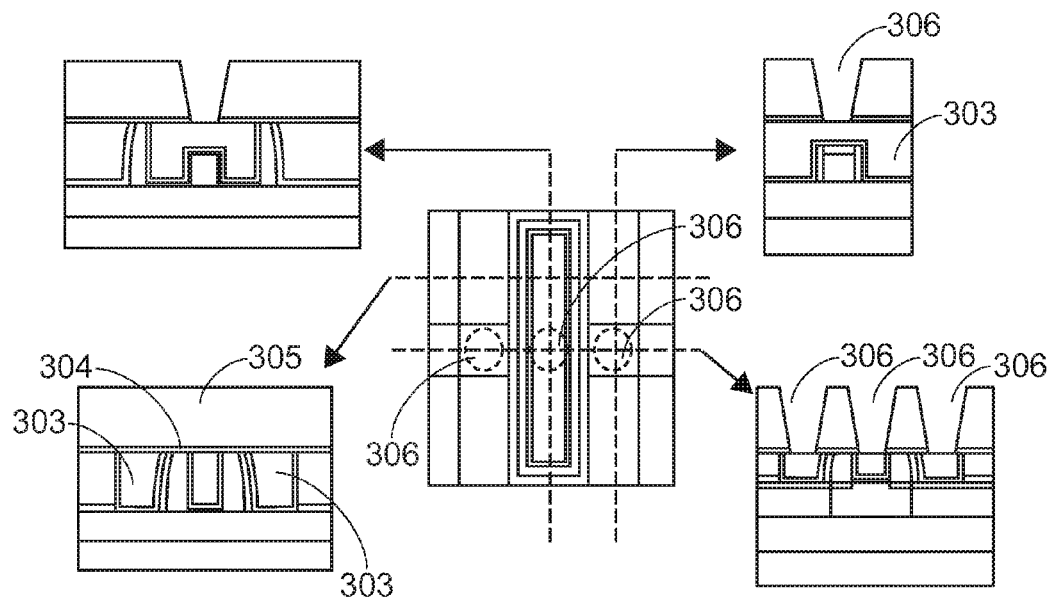
Figure 3E:
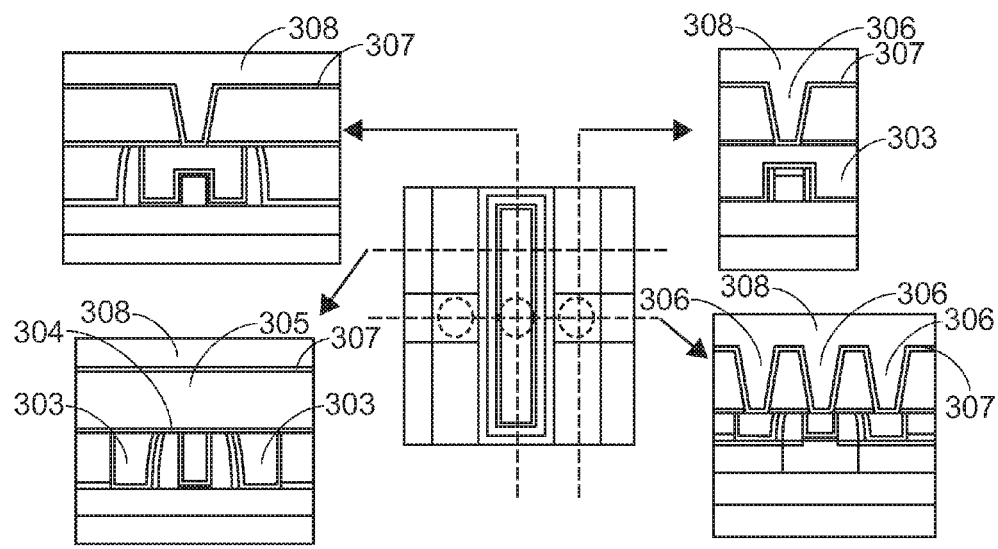
Figure 3F:
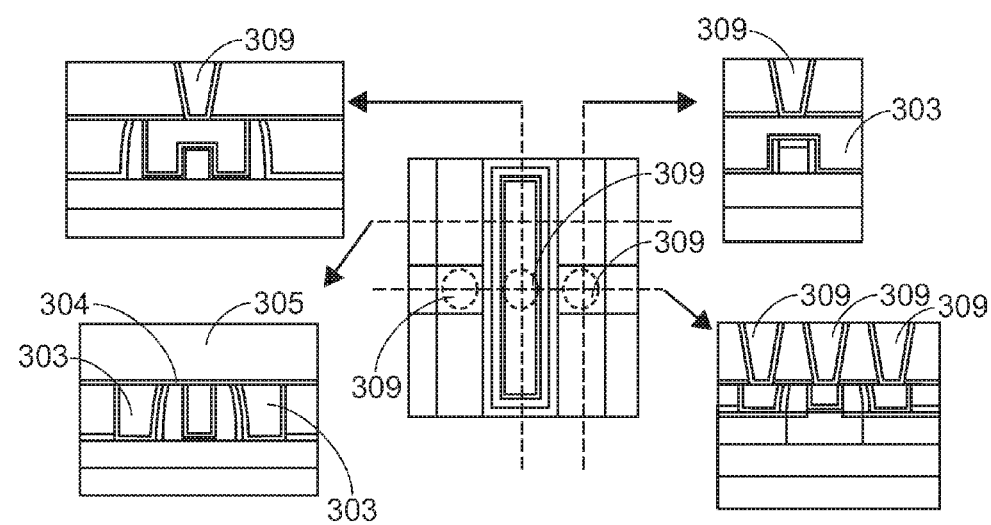
Figure 3G:
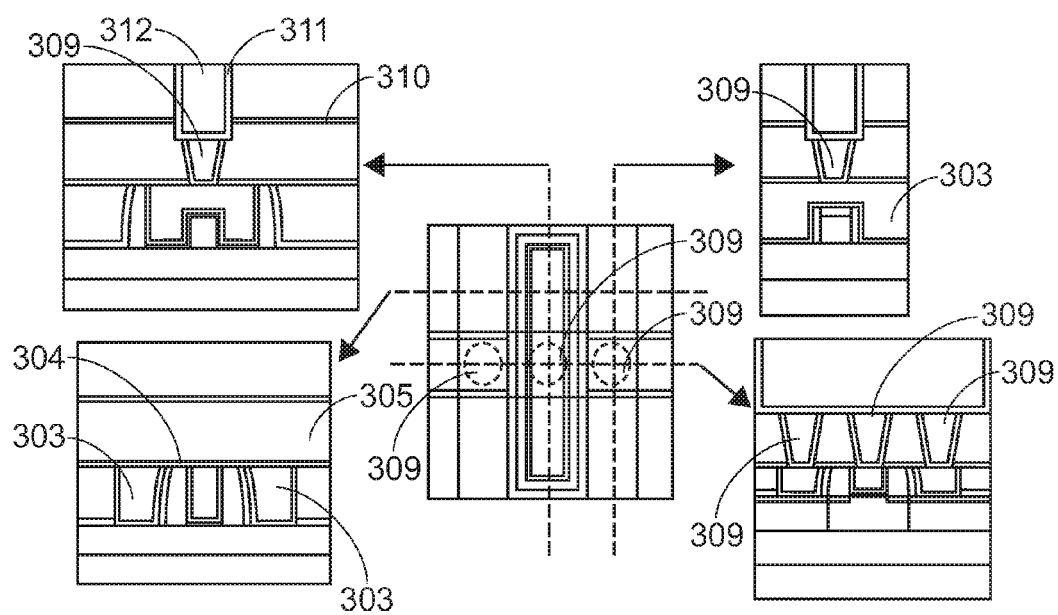

Then, as shown in FIG. 3D, a metal gate cap layer 304 and a dielectric layer 305 are formed on the substrate 2 having the slot contact structures 303. Then, by defining the regions of the metal gate cap layer 304 and the dielectric layer 305 over the source, the drain and the gate, thereby forming contact holes 306 (see FIG. 3E). Then, a barrier layer 307 and a copper layer 308 are formed on the substrate 2 having the contact holes 306. Then, as shown in FIG. 3F, a planarization process (e.g. a chemical mechanical planarization) is performed to remove the excess copper layer 308, thereby forming copper contact structures 309.

Then, the above damascene process is performed again to form a dielectric layer 310, a barrier layer 311 and a copper contact structure 312, so that the metal lines and the dielectric layers are produced.

Figure 4A:
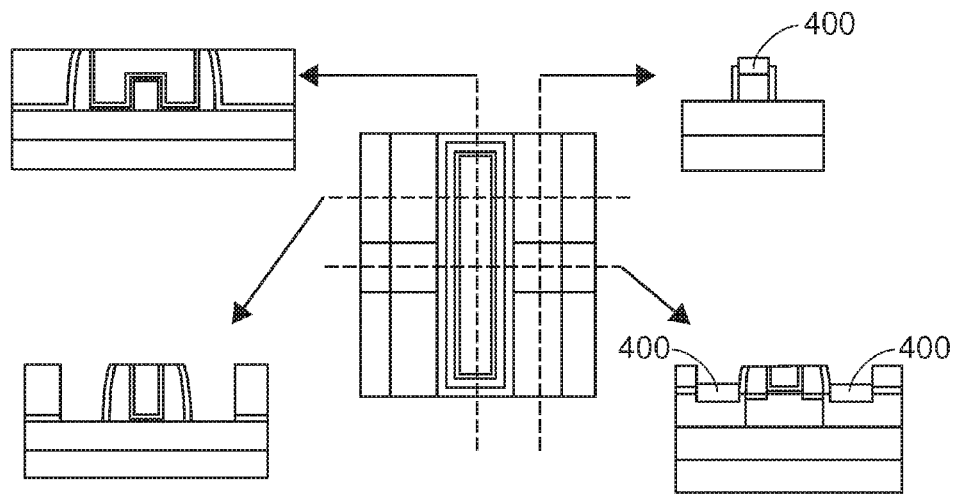
FIGS. 4A and 4B are schematic views illustrating a process of forming a salicide layer according to another embodiment of the present invention.
Figure 4B:
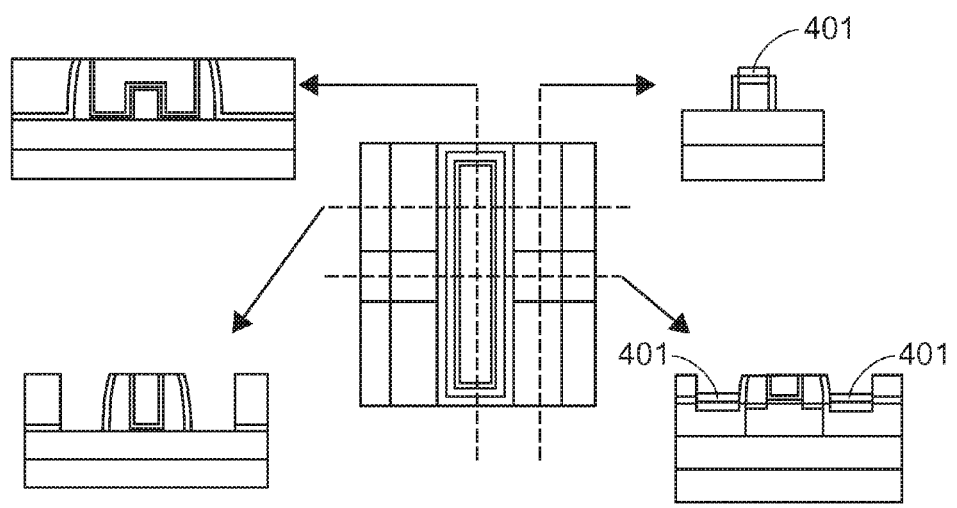

It is noted that numerous modifications and alterations of the connection member may be made while retaining the teachings of the invention. For example, the step of forming the salicide layer 295 on the surface of the source/drain region 296 (as shown in FIG. 2F) may be modified. FIGS. 4A and 4B are schematic views illustrating a process of forming a salicide layer according to another embodiment of the present invention. After the slot contact holes 301 as shown in FIG. 3A are produced, a selective epitaxial growth (SEG) process is performed to form a raised epi-layer 400 on the surface of the source/drain region 296 (see FIG. 4A), and then a self-aligned salicidation process is performed to form a salicide layer 401 on the surface of the raised epi-layer 400 (see FIG. 4B). In an embodiment, a silicon epitaxial layer is simultaneously deposited on the NMOS and the PMOS. In some embodiments, different epitaxial materials may be respectively formed on the NMOS and the PMOS. For example, a silicon carbide (SiC) epitaxial layer is formed on the NMOS, and a silicon germanium (SiGe) epitaxial layer is formed on the PMOS. In some embodiments, after selective epitaxial growth (SEG) process is performed, the NMOS and the PMOS are respectively doped with different dopants. For example, the NMOS is doped with a carbon dopant, and the PMOS is doped with a germanium dopant.

Moreover, the salicide layer 401 used in the present invention is made of NiPtSi, wherein the concentration of platinum is about 5~10% or even more than 10%. In a case that a platinum-nickel (NiPt) alloy and a silicon germanium (SiGe) epitaxial layer are collectively employed, a silicon epitaxial layer or a low-Ge (low-Ge-concentration) silicon germanium epitaxial layer may be firstly formed on a high-Ge (high-Ge-concentration) silicon germanium epitaxial layer and then electroplated with a platinum-nickel (NiPt) alloy. In such way, a NiPtSi(Ge) salicide layer is produced.

From the above description, the FinFET structure and the manufacturing process of the FinFET structure according to the present invention can effectively overcome the drawbacks encountered from the prior art.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing process of a fin field-effect transistor structure, the manufacturing process comprising steps of:
   providing a substrate;
   forming a fin channel on the substrate;
   forming a pseudo gate structure on a surface of the fin channel;
   performing a lightly doped drain implantation process on the fin channel, so as to form a lightly doped drain region in the fin channel;
   forming a source/drain region in the fin channel;
   forming a first dielectric layer over the fin channel having the source/drain region, the pseudo gate structure and the substrate;
   performing a first planarization process until the pseudo gate structure is exposed;
   removing the pseudo gate structure to form a receiving space;
   forming a high-k dielectric layer and a metal gate layer on the substrate having the receiving space; and
   performing a second planarization process on the substrate having the metal gate layer until the first dielectric layer is exposed, so that a high-k metal gate is produced.

2. The manufacturing process according to claim 1, wherein the substrate is a silicon-on-insulator wafer comprising a handle wafer, a buried oxide layer and a silicon layer.

3. The manufacturing process according to claim 1, wherein the pseudo gate structure and the fin channel are perpendicular to each other.

4. The manufacturing process according to claim 1, wherein the pseudo gate structure comprises an inter-layer dielectric layer, a silicon layer and a hard mask layer.

5. The manufacturing process according to claim 4, wherein the first planarization process is performed until the silicon layer is exposed.

6. The manufacturing process according to claim 1, further comprising forming a spacer structure on a sidewall of the pseudo gate structure before the forming of the source/drain region.

7. The manufacturing process according to claim 6, further comprising the steps of:
   forming a salicide layer on the source/drain region; and
   performing a sliming process on the spacer structure.

8. The manufacturing process according to claim 1, further comprising steps of:
   forming at least one slot contact hole to expose the source/drain region after the second planarization process is carried; and
   filling a first metal layer in the slot contact hole.

9. The manufacturing process according to claim 8, further comprising forming a salicide layer on a surface of the source/drain region before filling the first metal layer in the slot contact hole.

10. The manufacturing process according to claim 9, further comprising forming an epitaxial layer on the surface of the source/drain region before the forming of the salicide layer.

11. The manufacturing process according to claim 1, further comprising forming a salicide layer on the surface of the source/drain region before the step of removing the pseudo gate structure.

12. The manufacturing process according to claim 11, further comprising steps of:
   forming a cap layer and a second dielectric layer over the source/drain region and the high-k metal gate; and
   forming a plurality of contact openings in the cap layer and the second dielectric layer;
   forming a second metal layer to fill the contact holes; and
   performing a third planarization process until the second dielectric layer is exposed.

13. A manufacturing process of a fin field-effect transistor structure, the manufacturing process comprising the steps of:
   providing a substrate;
   forming a fin channel on the substrate;
   forming an inter-layer dielectric layer having a trench perpendicular to the fin channel;
   forming a high-k dielectric layer and a metal gate layer in the trench;
   performing a second planarization process on the metal gate layer, so that a high-k metal gate is produced;
   forming a source/drain region in the fin channel;
   forming a cap layer and a second dielectric layer over the source/drain region and the high-k metal gate; and
   forming a plurality of contact openings on the source/drain region and the high-k metal gate;
   forming a second metal layer to fill the contact openings; and
   performing a third planarization process until the second dielectric layer is exposed.

14. The manufacturing process according to claim 13, wherein the steps of forming of the inter-layer dielectric layer having the trench comprises:
   forming a pseudo gate structure on a surface of the fin channel;
   covering the pseudo gate structure with a first dielectric layer;
   performing a first planarization process until the pseudo gate structure is exposed; and
   removing the pseudo gate structure to form a receiving space.

15. The manufacturing process according to claim 14, before the pseudo gate structure is covered with the first dielectric layer, further comprising the steps of:
   forming a spacer structure on a sidewall of the pseudo gate structure;
   forming of a source/drain region in the fin channel; and
   performing a sliming process on the spacer structure.

16. The manufacturing process according to claim 15, after the second planarization process is carried out, further comprising steps of:
   forming at least one slot contact hole in the first dielectric layer to expose the source/drain region; and
   filling a first metal layer in the slot contact hole.

17. The manufacturing process according to claim 16, further comprising forming a salicide layer on a surface of the source/drain region before filling the first metal layer in the slot contact hole.

18. The manufacturing process according to claim 17, further comprising forming an epitaxial layer in the slot contact hole before the forming of the salicide layer.

* * * * *